United States Patent [19]

Swanberg

[11] Patent Number: 4,635,000
[45] Date of Patent: Jan. 6, 1987

[54] TEMPORAL PIXEL CLOCK SYNCHRONIZATION SYSTEM

[75] Inventor: Melvin E. Swanberg, Claremont, Calif.

[73] Assignee: Xerox Corporation, Stamford, Conn.

[21] Appl. No.: 797,352

[22] Filed: Nov. 12, 1985

[51] Int. Cl.⁴ .................... H03L 7/08; H04N 1/04
[52] U.S. Cl. ................................. 331/10; 331/17; 331/25; 328/155; 358/265; 358/267
[58] Field of Search .............. 331/17, 10, 18, 25; 328/155; 358/256, 264, 265, 267, 280, 282, 285; 346/160

[56] References Cited

U.S. PATENT DOCUMENTS 4,320,420 3/1982 Rider ............................. 358/267
4,342,050 7/1982 Traino ........................... 358/256

Primary Examiner—Siegfried H. Grimm
Attorney, Agent, or Firm—Leonard Zalman

[57] ABSTRACT

A temporal pixel clock synchronization system with jitter correction for an optical scanning system having a continuously running pixel clock source, circuitry for generating timing error signals having an amplitude representing any phase error between start of scan and start of pixel count pulses and any phase error between end of scan and end of pixel count pulses and circuitry, including a switched filter circuit with two storage elements for each facet of the polygon of the system, for generating a frequency correction signal for the pixel clock source.

4 Claims, 12 Drawing Figures

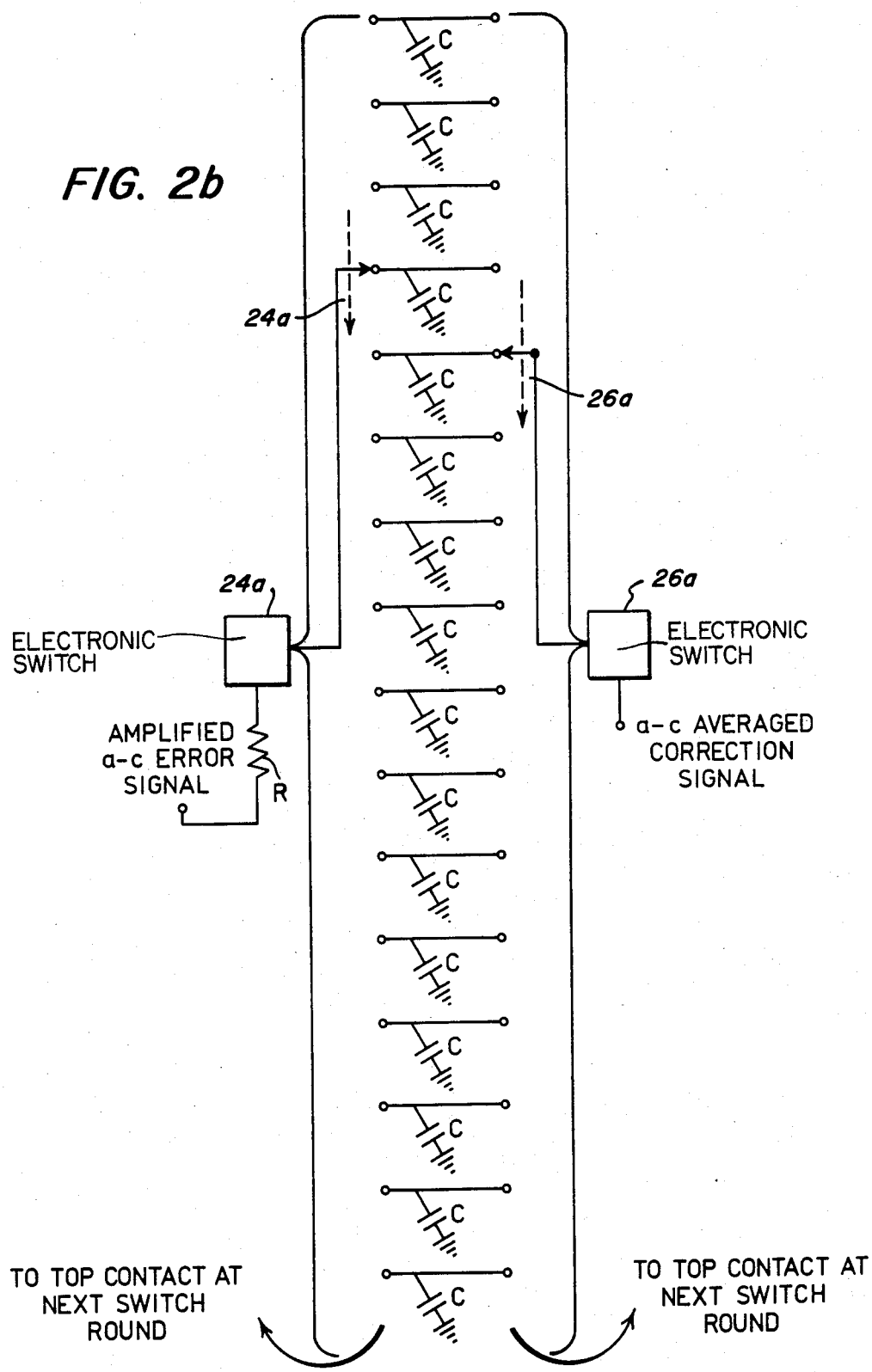

TEMPORAL PIXEL CLOCK SYNCHRONIZATION SYSTEM

BACKGROUND OF THE INVENTION

Historically, scan synchronization for optical scanners has been performed by detecting and generating a signal pulse at the instant that the scanning spot crosses a fixed point, generally called Start Of Scan (SOS). This SOS pulse is used to synchronize a stable, gated clocking oscillator, which, in turn, controls the flow of pixel data into the beam modulator. If the spot velocity is constant and consistent, the printer pixel density is constant for each line. If the spot velocity varies, as caused by polygon motor "hunting", or if the oscillator has a tendency to drift, the resulting printed pixel density would vary accordingly, in the scan direction. This pixel placement error is generally referred to as jitter, particularly when varying errors occur in adjacent, or closely spaced scan lines.

To reduce such jitter problems, it has been customary, as shown in FIG. 1, to include a split detector at the End Of Scan (EOS), which in conjunction with the SOS split detector, a pixel counter, and phase detector, provides a measure of any error between the spot velocity and pixel clock frequency. Specifically, referring to FIG. 1, an SOS signal generated by a conventional SOS split detector pulse circuit 2 gates on a voltage controlled oscillator (VCO) clock generator 4 of conventional construction and starts the counting of the SOS to EOS interval clock counter 6. Counter 6 has stored therein the number of pixels which are desired for the interval between SOS and EOS, and when that number of clock pulses is received from the output of oscillator 4 an End of Count (EOC) signal is generated and applied to one input of a phase detector or comparator 8 of conventional construction. The second input to phase detector 8 is the EOS signal generated by EOS split detector pulse circuit 10. Detector pulse circuits 2 and 10 are shown schematically in their simplest form in FIG. 1a in which photodetectors #1 and #2 represent respective halves of the split detector. FIG. 1a also shows the outputs of photodetectors #1 and #2 and the output of the difference amplifier. Note that detectors #1 and #2 are back biased to reduce detector capacitance and that load resistors $R_L$ are provided for high speed operation. Phase detector 8 is a temporal comparator which provides, by phase comparison, an output signal having a width or length equal to or proportional to the timing difference between the EOS and the EOC signals. Phase detector 8 has two output terminals providing "pump signals" in accordance with the phase comparison; a pump signal of proper width appearing at the "UP" output terminal if the EOS signal precedes the EOC signal in phase and a pump signal of the proper width appearing at the "DOWN" terminal if the EOS signal lags the EOC signal in phase. The pump up or pump down signals are applied to a differential integrator 12 of conventional construction which integrates up or down to vary its output voltage amplitude change proportionally to the width of the input pulse at any one time, thereby providing an error signal representative of the timing difference between the spot velocity and the pixel clock frequency.

The timing of the EOS and EOC pulses received at the inputs of phase comparator 8, together with the timing of the "pump up" and "pump down" output pulses from the phase comparator 8 that are delivered to the integrator 12, together with the integrator output voltage waveform may be as shown as in FIG. 1b as an example of the relationships of these signals. For facet #1 and facet #2 the EOS pulses precede the EOC pulses indicating that the VCO pixel clock frequency was too low for the spot velocity during those scans, and causing the generation of "pump up" pulses by the phase comparator 8. For facet #3 the EOS pulse lags the EOC pulse indicating that the pixel clock frequency was too high for the spot velocity during that scan and causing the generation of a "pump down" pulse by the phase comparator 8. This sequence continues for each of the facets in turn, generating the appropriate "pump up" and "pump down" pulses in accordance with the spot velocity and pixel clock frequency, and repeating each revolution of the polygon.

If the pixel clock frequency is consistently low during a series of scans such as for a number of polygon revolutions, then the integrator output voltage will be "pumped" up consistently, whereas if the pixel clock frequency is consistently high during a series of polygon revolutions, then the integrator output will be "pumped" down consistently. The integrator 12 output is applied to the gated VCO 4 via a low pass filter 14 and combining circuit 16 such that when the pixel clock frequency is low and the integrator output is "pumped" up this change in the control voltage that is applied to the VCO will increase the pixel clock frequency that is generated by the VCO 4. Conversely, when the pixel clock frequency is high and the integrator output is "pumped" down this change in the control voltage that is applied to the VCO will decrease the pixel clock frequency that is generated by the VCO 4. This phase locked feedback provides the means whereby the pixel clock frequency is maintained in accordance with the spot velocity and the number of pixels that are desired to be placed between the SOS and EOS detector spacing.

Properly implemented, this phase locked loop provides long term stability for relatively low frequency fluctuations. This low frequency response limitation is due to the delay that is intrinsic to the technique, i.e., the change in the correcting error signal that is developed is based on the scan that has just been completed, and cannot correct the error in the scan that produced this change. Thus, the feedback correction that is based on one scan, can only be applied to the next scan, and those scans that follow. This delay represents a phase shift, and as such, limits the unity gain bandwidth that can be achieved without causing loop instability and oscillations.

The function of the low pass filter 14 is to provide the bandwidth limit which is necessary to achieve a stable loop. However, there are scan to scan cyclic spot velocity errors that are beyond this bandwidth but must still be corrected. These cyclic errors, caused by differences in the polygon facets, or by the polygon motor cogging, are called "signature" or "synchronous" errors because of their unique, but repetitive nature, i.e. one cycle per polygon revolution.

This "signature" error signal is composed of square wave segments, each segment representing the spot velocity error that is produced by its respective facet. Having one segment per facet, and repeating every revolution of the polygon, the lowest information frequency of this "signature" waveform will be equal to the polygon speed (RPS). The highest information frequency of this "signature" waveform will be equal to the RPS frequency times the number of facets on the polygon divided by two. All other information frequencies that may be present in the "signature" waveform will be in accordance with the combinations of the amplitudes of these segments, i.e. they will be synchronous harmonics of the polygon rotation, all other frequencies are considered to be noise. Because of the nature of this "signature" error signal, it can be filtered, stored, phase shifted, and summed back into the feedback loop, and can thereby reduce the effects of such scan to scan spot velocity "signature" errors. A description of this signal processing follows.

Returning to FIG. 1, band pass filter 18, with gain in the frequency range of the "signature" waveform, receives the error signal of integrator 12 and outputs an amplified a-c error correction signal to a switched filter circuit 20 having a single input resistor and capacitors equal in number to the number of facets of the scanner polygon, i.e. one capacitor per facet. Referring to FIG. 1c, the filter circuit 20 is seen to contain for an 8 facet polygon, for example, an 8 contact electronic switch 24 (shown as its mechanical equivalent for simplicity) that demultiplexes the input signal to 8 capacitors C, and a second 8 contact electronic switch 26 (also shown as its mechanical equivalent for simplicity) that re-multiplexes the capacitor voltages into the single output terminal of the switched filter circuit 20. The electronic switch 24 forming part of the filter circuit 20 applies the a-c error correction signal in succession to the individual input terminals of the filter elements, in synchronism with the polygon facets, thus in synchronism with the segmented error waveform.

While the input signal is applied to a capacitor via the resistor R and switch 24, it forms a low pass RC circuit, and the voltage on the capacitor will change in accordance with the RC time constant and the voltage at the input at that time. When the input switch 24 is open, the capacitor is isolated, and the voltage that was impressed on it at the termination of the charging interval remains, i.e. the capacitor now acts as a storage element, until once again that particular switch element closes, and again connects that capacitor to the same segment of the next cycle of the signature waveform.

The RC time constant that the resistor R forms with each capacitor C in turn, is long relative to the rotational speed of the polygon, taking many revolutions of the polygon for each capacitor to reach a voltage that is close to the voltage of its respective segment of the input waveform. The effective RC time constant is actually longer than the product of resistance and capacitance, as each capacitor is charging for only part of the time. Thus, the effective time constant can be artificially lengthened by allowing each input switch element to close for a time that is shorter than the actual input waveform segment.

The electronic switch 24 that forms a part of the filter input circuit as described above, has an output counterpart, i.e. a switch 26 that connects the filter/storage capacitors to the output terminal in a sequential manner as with the input switch elements. The voltage output from this second switch is thus a recreation of the input waveform except that it has been filtered of all frequencies that are not synchronous with the polygon rotation or harmonics thereof, in accordance with the number of facets. Also, the timing of the input and output switches being controlled by the SOS signal and being such that when an input terminal of one filter element is receiving the a-c error correction signal the output terminal of the next preceding filter element is being accessed. Thus not only is the input waveform filtered of all extraneous frequencies but it is also delayed by one whole revolution of the polygon less the delay of one facet. This delay is an important aspect of the switched filter as it compensates for the phase shift that is caused by the delay that is inherent in the generation of the error signal, and was the cause for limiting the loop bandwidth with the low pass filter 14.

If at the start of scan a voltage is applied to the VCO such to cause the generation of a frequency that is too low to generate the prescribed number of pixels in that scan, then at the end of scan the phase detector generates a "pump up" signal that increases the VCO applied voltage in an attempt to correct that error. As previously described, this new correction voltage comes too late to make the correction for that facet. This delay of the correction signal represents the phase shift that limits the loop bandwidth that can be used for error correction. However, introducing additional delay, i.e. by delaying the error correction signal one full cycle, less the delay of one facet that is already present, then the error correction signal will now be in phase again, by virtue of the fact that a 360 degree phase shift of a repetitive wave form is the same as no phase shift at all. This delayed signal from the switched filter or auxiliary loop, herein called an "S" circuit, can now be used in a feedback manner to compensate for the "signature" errors and thereby reduce such errors by an order of magnitude or more.

Synchronization of the pixel clock to the spot velocity, using the techniques described above, have been successful for achieving scan to scan registration of exposure profiles to a consistent accuracy of one part in 20,000. The remaining jitter is primarily random, having a frequency range from a fraction of a hertz, up to one half the scan frequency. (Jitter frequencies that are higher than half the scan rate manifest themselves as a lower beat frequency.) Recent work has indicated the possibility of reducing the sources of these errors, such as shielding the electronics and VCO from external noise sources. However, there are practical limits, as well as theoretical limits to which these random or non synchronous sources of jitter can be reduced.

One method (and often the only method) of reducing the effects of noise in a system, is by reducing the bandwidth. The high bandwidths needed by the synchronizing techniques used in the past (FIG. 1), arise from the need to synchronize a pixel clock at the start of scan, the need for a high speed comparator at the end of scan, and the need for a low Q VCO that can be gated on rapidly. Although the circuit of FIG. 1 utilizes all of the above high speed circuits, it is interesting and significant to note that the control loop for the VCO has a very low bandwidth relative to the bandwidths mentioned above, this bandwidth limitation being necessary in order to achieve loop stability, but it is also effective in reducing the effects of noise in that particular circuit function.

It would be advantageous if the same type of bandwidth limiting techniques, as used in the EOS function, be used for the generation of the SOS synchronizing function as well, and the achievement of such is provided by the systems hereinafter described.

SUMMARY OF THE INVENTION

A temporal pixel clock synchronization system with jitter correction for an optical scanning system having a continuously running pixel clock source, circuitry for generating timing error signals having an amplitude representing any phase error between start of scan and start of pixel count pulses and any phase error between end of scan and end of pixel count pulses and circuitry, including a switched filter circuit with two storage elements for each facet of the polygon of the system, for generating a frequency correction signal for the pixel clock source.

BRIEF DESCRIPTION OF THE DRAWINGS

FIG. 2b shows the arrangement of the switched filter circuit of FIG. 2.

DETAILED DESCRIPTION OF THE INVENTION

Figure 1:
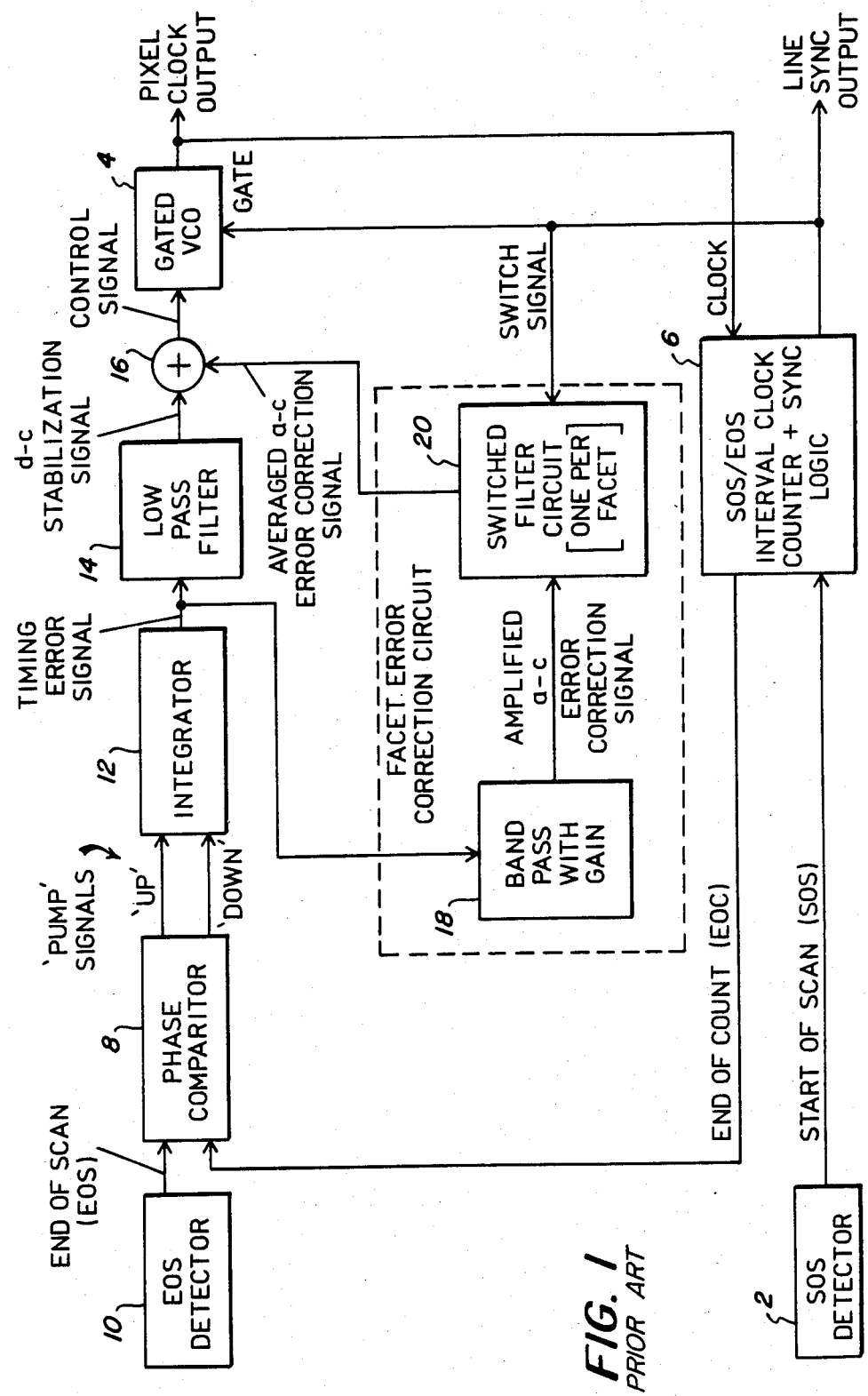
FIG. 1 is a block diagram of a prior art circuit utilized to reduce pixel placement errors generally referred to as jitter.
Figure 2:
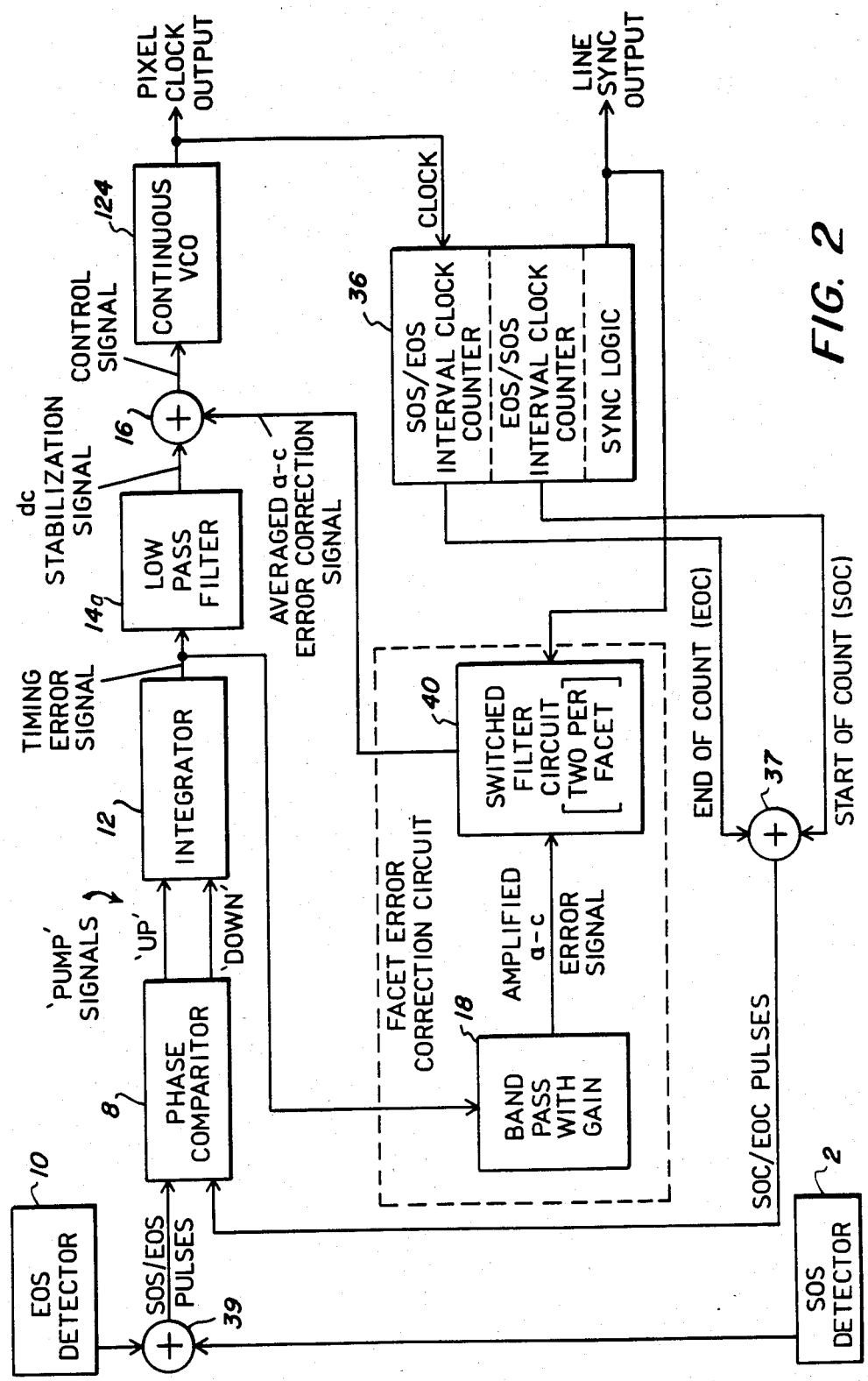
FIG. 2 is a block diagram of a narrow bandwidth temporal pixel clock synchronization system.

Referring now to FIG. 2, there is shown a narrow bandwidth pixel clock system wherein each component corresponding to a like component of FIG. 1 has the same reference numeral. Note that in FIG. 2, the gated oscillator 4 of FIG. 1 has been replaced by a continuously running, voltage controlled, high Q, pixel clock oscillator 124. This oscillator 124 can be given a high Q because in the configuration of FIG. 2 it is not necessary to gate the oscillator on and off. Continuously running high Q oscillators have been used in the past, but not in the manner presented in FIG. 2. Typically, these conventional systems use a continuously running fixed frequency oscillator at some multiple, for example, 10 times, the pixel data rate. The SOS signal then gates a counter circuit to the nearest fractional pixel that is provided by this oscillator. The shortcomings of this technique is that the oscillator must be operated at very high frequencies to get good "resolution", and that this "resolution jitter" is added to the noise jitter of the SOS pulse timing. In the system described herein in relation to FIG. 2, this is not the case, as instead of adding to the SOS noise jitter, clock system described herein effectively reduces noise jitter. In other forms of the clock system described herein where pixel frequencies are not extremely high, one may use an oscillator with a fixed frequency that is a multiple of the pixel frequency in conjunction with a frequency multiplier scheme, and thereby derive the digital equivalent of the analog VCO that is shown in FIG. 2. In either case, digital or analog, the use of a high Q oscillator is important.

Figure 3:
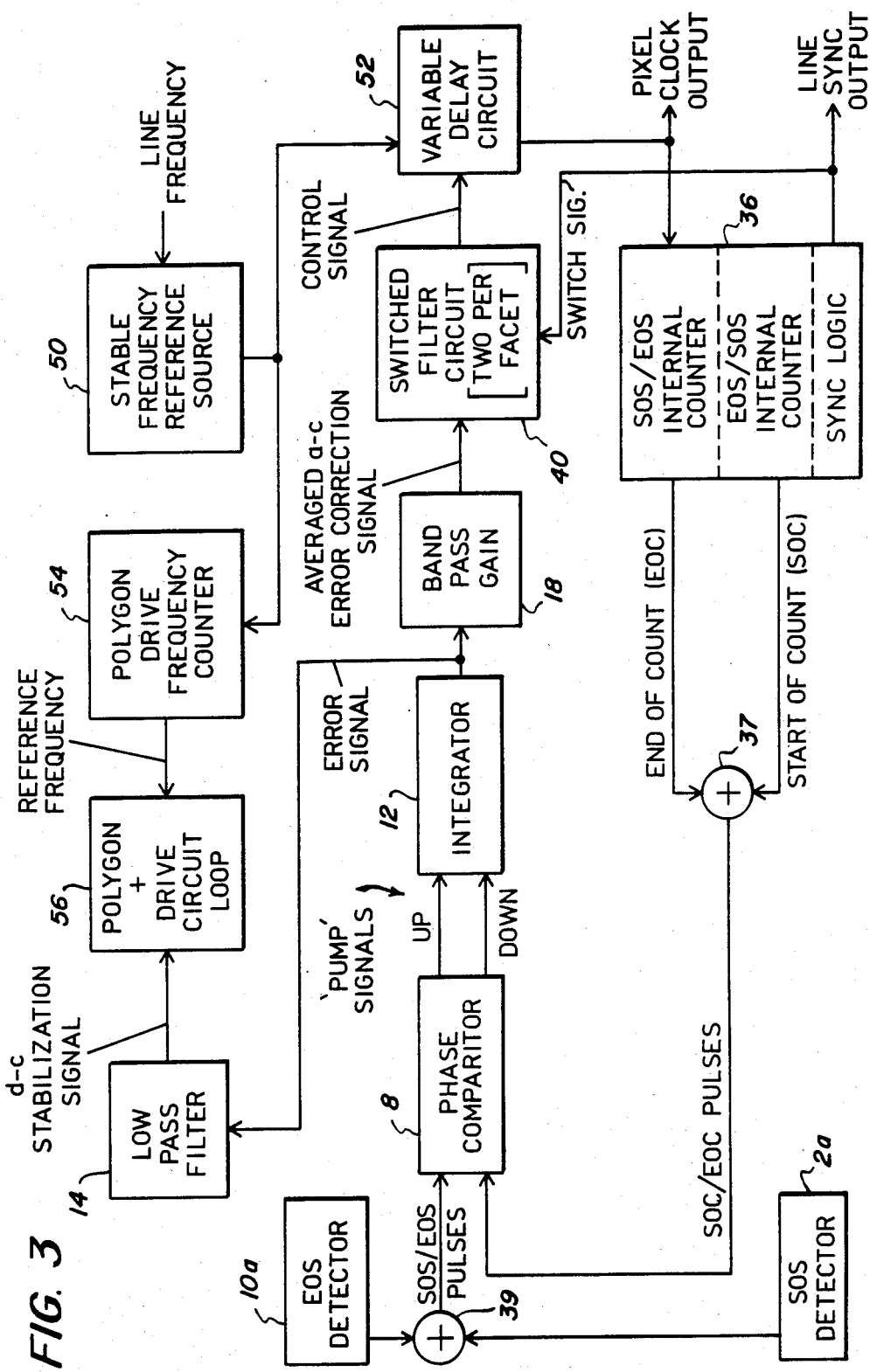
FIG. 3 is a block diagram of a narrow bandwidth temporal pixel clock synchronization system utilizing a stable frequency reference device.

An accurate method of synchronizing a high Q continuously running oscillator would be to employ a long term synchronization between the pixel clock and the light deflecting polygon scanner, i.e. to provide long term synchronization that generates and maintains the proper number of pixels per revolution, while also providing a short term correction between each SOS/EOS interval as is customary while also providing a short term correction between each EOS/SOS interval. This form of synchronization is illustrated in FIGS. 2 and 3, each utilizing a switched filter "S" circuit as mentioned in relation to FIG. 1, but in these configurations two filter/storage elements are provided for each facet as opposed to only one per facet as previously described in relation to FIG. 1.

Typically, raster scanning systems such as that shown in FIG. 1 use a synchronous motor, or synchronously servo controlled motor for the polygon scanner, the motor drive frequency or the servo reference frequency being derived from a stable oscillator in order to provide long term accuracy of the scanning rate. The SOS/EOS interval is of course a result of this scanning rate, and the pixel clock output of FIG. 1 is in effect synchronized to this scan rate by way of gated VCO 4 that is phase locked to this SOS/EOS interval. The gated VOC of FIG. 1 can be replaced by a continuously running VCO 124, as shown in the configuration of FIG. 2, by extending the clock counter 6 of the conventional system of FIG. 1 to include the nominal pixel count that would occur during the interval between the end of one scan and the start of the next scan, i.e. the EOS/SOS interval. In FIG. 2, the interval counter 36 generates not only EOC pulses, but also Start Of Count (SOC) pulses, each occurring at a time corresponding with the expected EOS and SOS detector pulses, respectively. The detection of the phase error can now be performed at both SOS and EOS, either with combined pulses and one phase detector, as shown in FIG. 2, or with separate pulses and separate phase detectors. In this case, an error "signature" signal is developed that is comprised of two segments for each facet, one segment for each SOS/EOS interval, and one segment for each EOS/SOS interval. This error signal is then stored by a switched filter circuit 40 similar to circuit 20 but now having a doubling of filter/storage elements because there are now two components for the error signal for each facet. These stored error signal segments can now be applied to the continuously running, high Q, voltage controlled oscillator 124 as an a-c correction signal to "pull" the VCO into proper phase synchronization with both the SOS pulses and the EOS pulses.

Referring now more specifically to FIG. 2, both the signal generated by the SOS detector 2 and the signal generated by the EOS detector 10 are applied to one input terminal of phase comparator 8. The output of the continuously running pixel clock oscillator supplies a clock signal to a counter assembly 36 that has stored in one section the number of pixels which is desired for the interval between SOS and EOS and has stored in another section the number of pixels which is desired for the interval between EOS and SOS. Assembly 36 also includes sync logic which provides a line sync output and a switching signal for switched filter circuit 40. When the desired number of pixels between SOS/EOS is received the counter 36 emits the EOC signal and, likewise, when the desired number of pixels between EOS and SOS is received the counter 36 emits the SOC signal. The EOC and SOC signals are combined by element 37, which can be an "or" circuit, and applied to the lower terminal of phase detector 8, while the EOS and SOS signals are combined by element 39, which also can be an "or" circuit, and applied to the upper terminal of phase detector 8.

The phase detector generates "pump up" and "pump down" pulses in a manner similar to that described for FIG. 1. Referring to FIG. 2, if the pixel clock frequency is consistently low during a series of scans as for a number of polygon revolutions, then the integrator 12 output voltage will be "pumped" up consistently, whereas if the pixel clock frequency is consistently high during a series of polygon revolutions, then the integrator output will be "pumped" down consistently. The integrator 12 output is applied to VCO 124 via low pass filter 14a such that when the pixel clock frequency is low and the integrator output is "pumped" up this change in the control voltage that is applied to the VCO will increase the pixel clock frequency that is generated by the VCO. Conversely, when the pixel clock frequency is high and the integrator output is "pumped" down this change in the control voltage that is applied to the VCO will decrease the pixel clock frequency that is generated by the VCO. This phase locked feedback provides the means whereby the pixel clock frequency is maintained in accordance with the spot velocity and the number of pixels that are desired to be placed between the SOS and EOS detector spacing.

The function of the low pass filter 14a of FIG. 2 is the same as the function of the filter 14 of FIG. 1, i.e. to provide the bandwidth limit which is necessary to achieve a stable loop. However, since the VCO 124 of the circuit in FIG. 2 is continuously running as opposed to the VCO 4 of FIG. 1 that is gated "ON" at each SOS, the phase locked loop of FIG. 2 has a different frequency response than the phase locked loop of FIG. 1, and thereby requires a different frequency response characteristic in the filter circuit in order to attain a stable loop.

In a system with a "perfect" polygon/motor/oscillator/optics etc. the intervals that occur between the SOS/EOS and EOS/SOS pulse sequences would be the same as the intervals that occur between the corresponding SOC/EOC and EOC/SOC pulses sequences. In such a "perfect" system there would be no errors in the pulse timing once the VCO is brought into phase lock. Realistically there are errors that occur due to imperfections in the system, for example, the angle between the various facets of the polygon may be slightly in error, some angles too high, and of course other angles being consequently too low, or as another example, an error or tolerance buildup in the optical magnification of the scan projection lens will result in a spot velocity error. The former type of error will cause a variation in the interval between one EOS pulse and the next SOS pulse that is generated from the respective facets, while the latter type of error, causing an error in the spot velocity, will cause an error in the time interval between the SOS and EOS pulses that are generated from all facets. Other sources of errors, even such as sub-wavelength curvature of facets, or pyramidal facet errors or wobble of only seconds of arc can cause variations in the time intervals of the scan detector pulses, these same errors also causing "signature jitter" effects in the output raster.

Figure 1B:
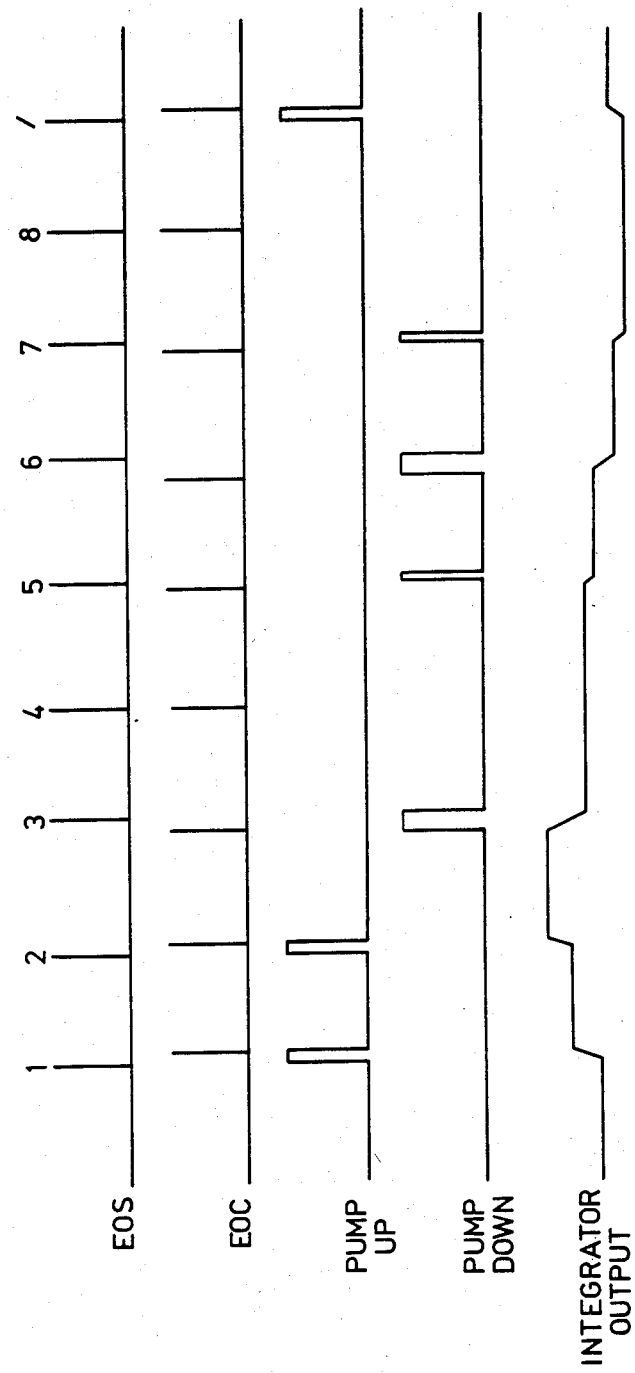
FIG. 1b shows examples of output voltage waveforms of the differential integrator of FIG. 1.
Figure 1C:
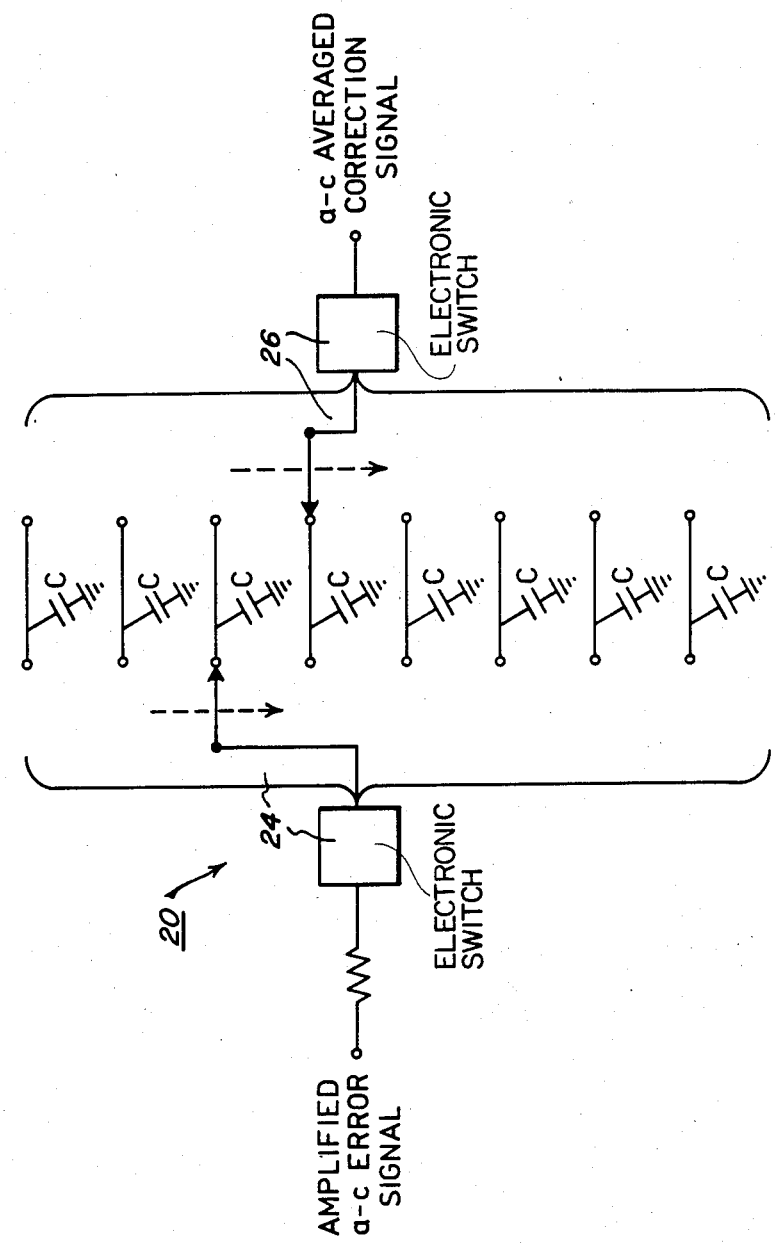
FIG. 1c shows the arrangement of the switched filter circuit of FIG. 1.
Figure 2A:
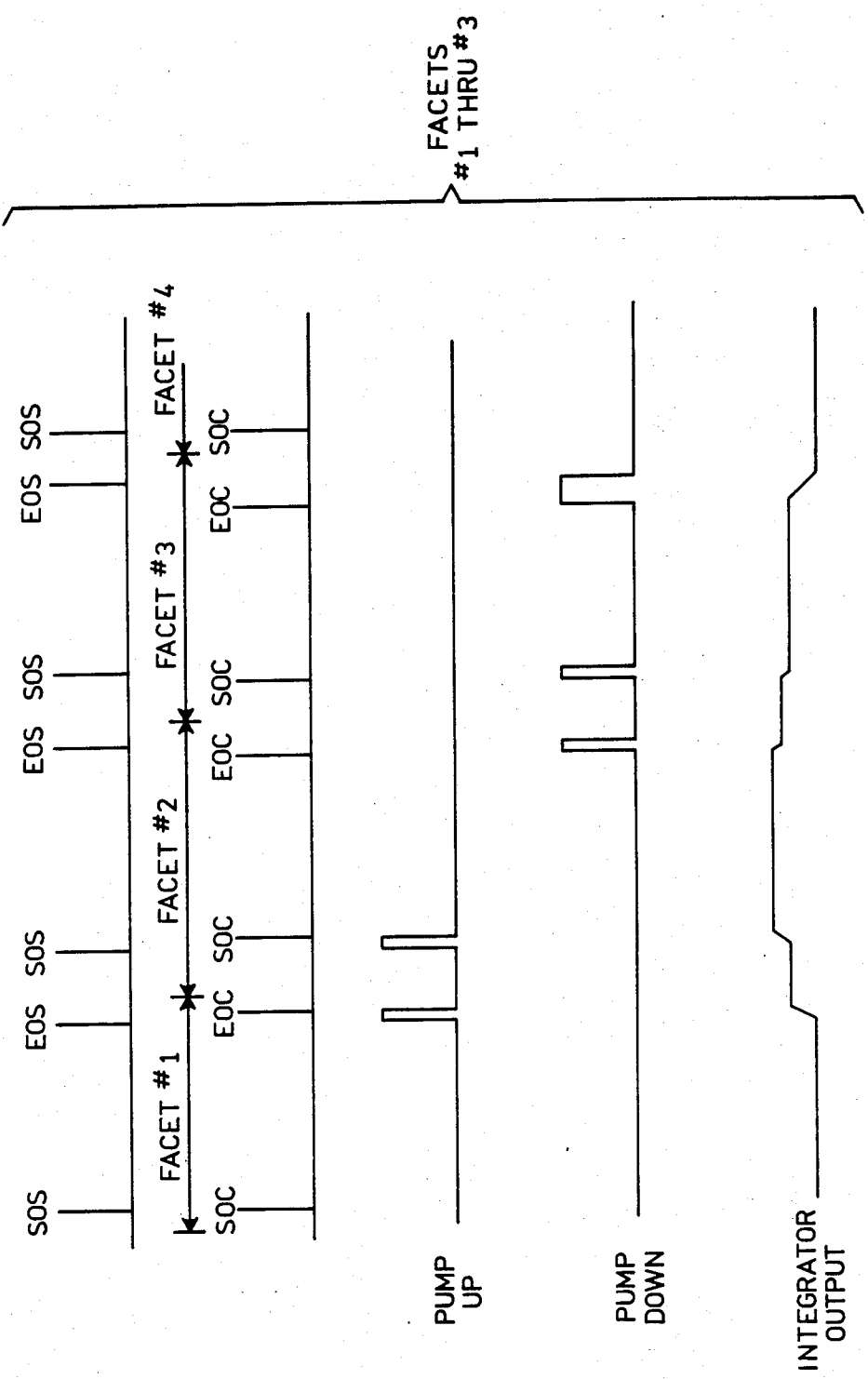
FIG. 2a shows various waveforms produced by the system of FIG. 2.

The timing of the SOS, SOC, EOS and EOC pulses received at the inputs of phase comparator 8, together with the timing of the "pump up" and "pump down" output pulses from the phase comparator 8 that are delivered to the integrator 12, together with the integrator output voltage waveform may be as shown as in FIG. 2a as an example of the relationships of these signals. Referring to FIG. 2a, for facet #1, the SOS pulse occurs simultaneous with the SOC pulse but the EOS pulse occurs prior to the EOC pulse which indicates that the spot velocity was too high relative to the pixel clock frequency during that scan, and a "pump up" signal is generated which in turn causes the integrator output voltage to be incremented upward. For facet #2, the SOS pulse also occurs prior to the SOC pulse, indicating that the pixel clock is still slow relative to the spot position, and thus another "pump up" signal is generated. However, the interval between the SOS and EOS pulses is shown to be longer for facet #2 than for facet #1, which then results in the EOS and the EOC pulses for facet #2 to occur near simultaneously with each other. The EOS pulse is shown to precede the EOC pulse by a small interval, which results in the generation of a short "pump down" signal, and a small decrease in the integrator output voltage. For facet #3, both the SOC and EOC pulses occur before the SOS and EOS pulses, and in both cases the "pump down" signals are generated. The pulses from facet #4 follow, with corresponding "pump up" or "pump down" signals being generated, and similarly this sequence of SOS/SOC and EOS/EOC pulses continues for each facet, and for each revolution, resulting in the generation of a "signature" waveform much the same as described for FIG. 1b, with the exception that this new "signature" waveform has two "segments" that correspond to each facet. These two segments represent the error between the pixel clock timing and the spot position, at the start of each scan, as well as at the end of each scan.

In the example given in FIG. 2a, and described above, a phase locked condition exists, and the average error for a full revolution is zero. Properly implemented, this phase locked loop provides long term stability for relatively low frequency fluctuations. This frequency response limitation is due to the delay that is intrinsic to the technique, i.e., the change in the correcting error signal that is developed is based on the sample that has just been completed, and cannot correct the error in the sample that produced this change. Thus, the feedback correction that is based on one sample can only be applied to the next sample period, and those sample periods that follow. This delay represents a phase shift, and as such, limits the unity gain bandwidth that can be achieved without causing loop instability and oscillations. Nevertheless, due to the nature of the "signature" error signal, it can be filtered, stored, phase shifted, and summed back into the feedback loop, and can thereby reduce the effects of such SOS and EOS pixel placement "signature" errors.

Returning to FIG. 2, a description of signal processing is provided. Band pass filter 18, with gain in the frequency range of the "signature" waveform, receives the error signal of integrator 12 and outputs an amplified a-c error correction signal to a switched filter circuit 40 having a single input resistor and capacitors equal in number to twice the number of facets of the scanner polygon, i.e. two capacitors per facet. Referring to FIG. 2b, the filter circuit is seen to contain for an 8 facet polygon, for example, an 16 contact electronic switch 24a (shown as its mechanical equivalent for simplicity) that demultiplexes the input signal to 16 capacitors, and a second 16 contact electronic switch 26a that re-multiplexes the capacitor voltages into the single output terminal of the switched filter circuit 40. The electronic switch forming part of the filter circuit 40 applies the a-c error correction signal in succession to the individual input terminals of the filter elements, in synchronism with the polygon facets, thus in synchronism with the segmented error waveform.

While the input signal is applied to a capacitor via the resistor and switch, it forms a low pass RC circuit, and the voltage on the capacitor will change in accordance with the RC time constant and the voltage at the input at that time. When the input switch is open, the capacitor is isolated, and the voltage that was impressed on it at the termination of the changing interval remains, i.e. the capacitor now acts as a storage element, until once again that particular switch element closes, and again connects that capacitor to the same segment of the next cycle of the signature waveform.

The RC time constant that the resistor forms with each capacitor in turn, is long relative to the rotational speed of the polygon, taking many revolutions of the polygon for each capacitor to reach a voltage that is close to the voltage of its respective segment of the input waveform. The effective RC time constant is actually longer than the product of resistance and capacitance, as each capacitor is charging for only part of the time. Thus, the effective time constant can be artificially lengthened by allowing each input switch element to close for a time that is shorter than the actual input waveform segment.

The electronic switch 24a that forms a part of the filter input circuit as described above, has an output counterpart 26a, i.e. a switch that connects the filter/storage capacitors to the output terminal in a sequential manner as with the input switch elements. The voltage output from this second switch is thus a recreation of the input waveform except that it has been filtered of all frequencies that are not synchronous with the polygon rotation or harmonics thereof, in accordance with the number of waveform segments. Also, the timing of the input and output switches being controlled by the SOS signal and being such that when an input terminal of one filter element is receiving the a-c error correction signal the output terminal of the next preceding filter element is being accessed. Thus not only is the input waveform filtered of all extraneous frequencies but it is also delayed by one whole revolution of the polygon less the delay of one waveform segment. This delay is an important aspect of the switched filter as it compensates for the phase shift that is caused by the delay that is inherent in the generation of the error signal, and was the cause for limiting the loop bandwidth with the low pass filter 14a.

Figure 2C:
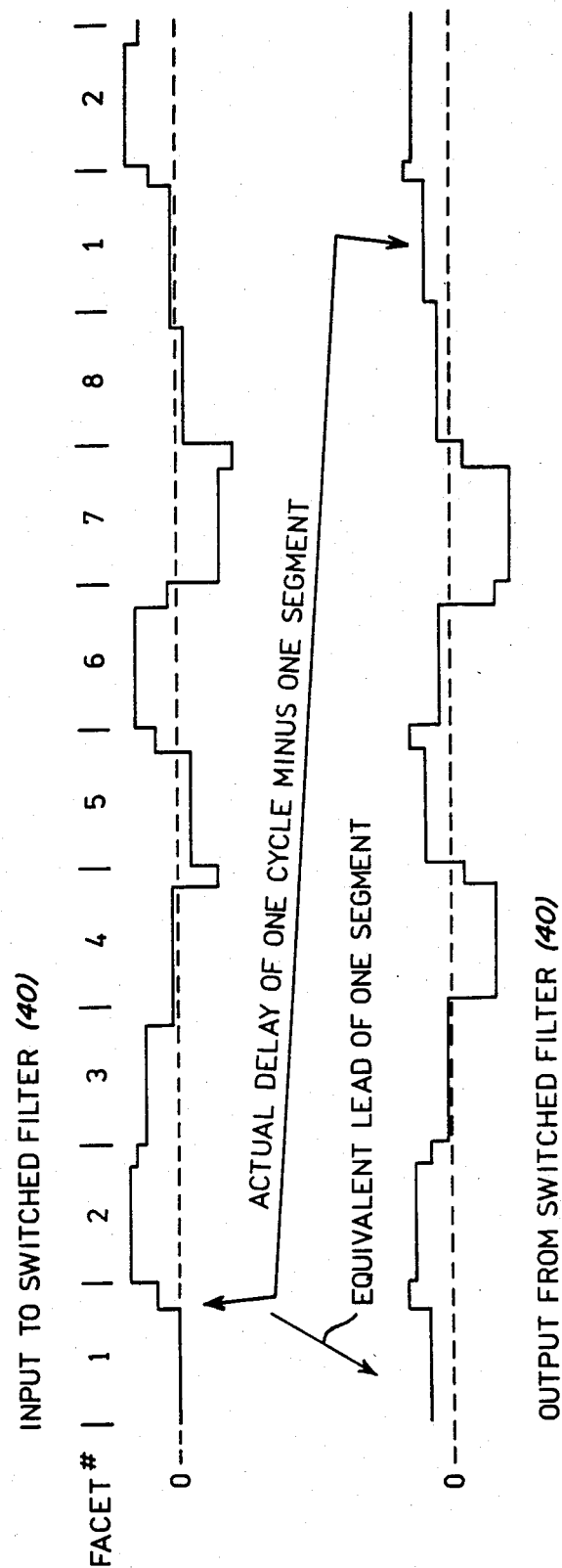
FIG. 2c shows typical input and output "signature" waveforms of the circuit of FIG. 2.

In the circuit of FIG. 1, and previously described, the output waveform from the switched filter circuit 20 is of the same form as the input waveform with the exception of random fluctuations of the "signature" and the delay that is introduced by the switching sequence. In the circuit of FIG. 2, the input waveform to the switched filter circuit 40 is composed of two segments for each polygon facet, these segments being of unequal width in accordance with the design of the optical system. In this case, the delay that is introduced by the switching sequence causes a further modification of the waveform in that those segments of the input waveform that are of a short interval become lengthened in the output waveform, and those segments of the input waveform that are of a long interval become shortened in the output waveform. Typical input and output "signature" waveforms are shown in FIG. 2c, and a further explaination of those waveforms follows.

If at the start of scan a voltage is applied to the VCO such to cause the generation of a frequency that is too low to generate the prescribed number of pixels in that scan, then at the end of scan the phase detector generates a "pump up" signal that increases the VCO applied voltage in an attempt to correct that error. As previously described, this new correction voltage comes too late to make the correction for that facet, and further, this error signal level is updated at the start of the next scan with the error that occurs between facets. Thus, the waveform segment that must be applied to the VCO during the relatively long scan period is actually of short interval. Conversely, the error signal level that is developed during the interval between scans is not updated until the end of the next scan and is thus of a long interval. It can thus be seen that the "signature" waveform that is developed at the output of the integrator 12 of FIG. 2 is not only delayed one segment from what is needed to correct the error, but that the segments of the error signal are of the wrong interval. The introduction of additional delay by the switched filter circuit 40 not only effectively corrects the delay error, but it also corrects the segment interval error. This delayed and modified signal from the switched filter auxiliary loop, herein called a "full S" circuit, can now be used in a feedback manner to compensate for the "signature" errors that occur between each scan as well during each scan, and effectively reducing jitter at both start of each scan and at the end of each scan.

The circuit shown in FIG. 2 utilizes a continuously running VCO that is in effect synchronously locked to the polygon drive by way of the SOS/EOS pulses and the low pass filter 14a portion of the VCO control loop. The result of this loop is that the long term frequency stability is such that a constant number of clock cycles occur for each revolution of the polygon. FIG. 3 shows a variation of the circuit shown in FIG. 2, wherein the VCO is replaced by the stable frequency reference source 50 that is used to derive the polygon drive frequency. This stable frequency reference is typically a crystal controlled oscillator, or in the event it is desired to synchronize the polygon rotational speed to a line synchronous function, such as a photoreceptor driven by a synchronous motor, then the stable frequency reference could be a VCO that is phase locked to the line frequency. In either case, this stable frequency source is utilized to control the polygon speed via the polygon drive frequency counter 54, and the polygon and drive circuit loop 56, as well as providing the pixel clock output via a variable delay circuit 52. This variable delay circuit provides the means to make the phase corrections that are necessary to correct for the polygon "signature" errors. The function of the variable delay circuit 52 may be implemented in one of several manners, such as a varactor delay line, or a VCO that is phase locked to the stable frequency reference through a d-c coupling, while the control signal from the switched filter circuit 40 is a-c coupled to the VCO control circuit for making the phase corrections. In either case, the long term stability between the polygon rotation speed and the pixel clock frequency is maintained in a more direct manner than by the means employed in the circuit of FIG. 2.

It has been shown that the "full S" circuit used in the configurations of FIG. 2 and FIG. 3 enables the use of a continuously running pixel clock frequency source, and that such a configuration provides an improvement in the stability of pixel placement. It will now be shown that with these new configurations a further improvement can be realized, as it enables the implementation of a new synchronization technique that is best described as "spatial synchronization" as opposed to the "temporal synchronization" that is presently used. A definition of these two different synchronization techniques is in order.

Temporal synchronization is the method whereby a spot position detector is used to determine when a scanning spot passes a given point, wherein this timing is used to synchronize the system clock and to develop clock synchronization error correction signals.

Spatial synchronization is the method whereby a spot position detector is used to determine the position of an exposure pattern i.e. a pixel, wherein the exposure position signal is used to correct clock synchronization errors.

One disadvantage of the temporal synchronization method is that the bandwidth of the detection system must be wide, and is thus susceptible to noise errors. A further disadvantage appears when this synchronization is used in a Scophony scanner, i.e. pulse imaged system. The scanning spot in such systems is indirectly related to the position of the pixel exposure, as the spot simply provides illumination of the acoustic wave that is then imaged to produce the exposure pattern of pixels. The spot size in such systems may be many pixels wide, and therefore provides for poor resolution and poor accuracy of synchronization.

The above disadvantages of the temporal synchronization method are overcome by the spatial synchronization method. For spatial synchronization, the detection system need not have a wide bandwidth, and a reduced bandwidth will reduce its susceptibility to noise. Also, this method of synchronization measures the true position of the reference pixel exposure, which is the prime purpose of any such synchronization system. This is particularly important in Scophony systems where the spot size may be many pixels wide, and the jitter caused by spot scintillation and dance can be significant.

In order to implement the spatial synchronization method, a means to measure the relative position of a pixel exposure is necessary, i.e. pixel placement sensing. A method that uses the same split detector, but different circuitry has been invented. This new detection system can replace the old temporal detection circuitry and thereby offer an improved performance over that which is shown in FIGS. 1, 2, and 3. A description of the new method follows, comparing the temporal detection circuit with the spatial detection circuit.

Figure 1A:
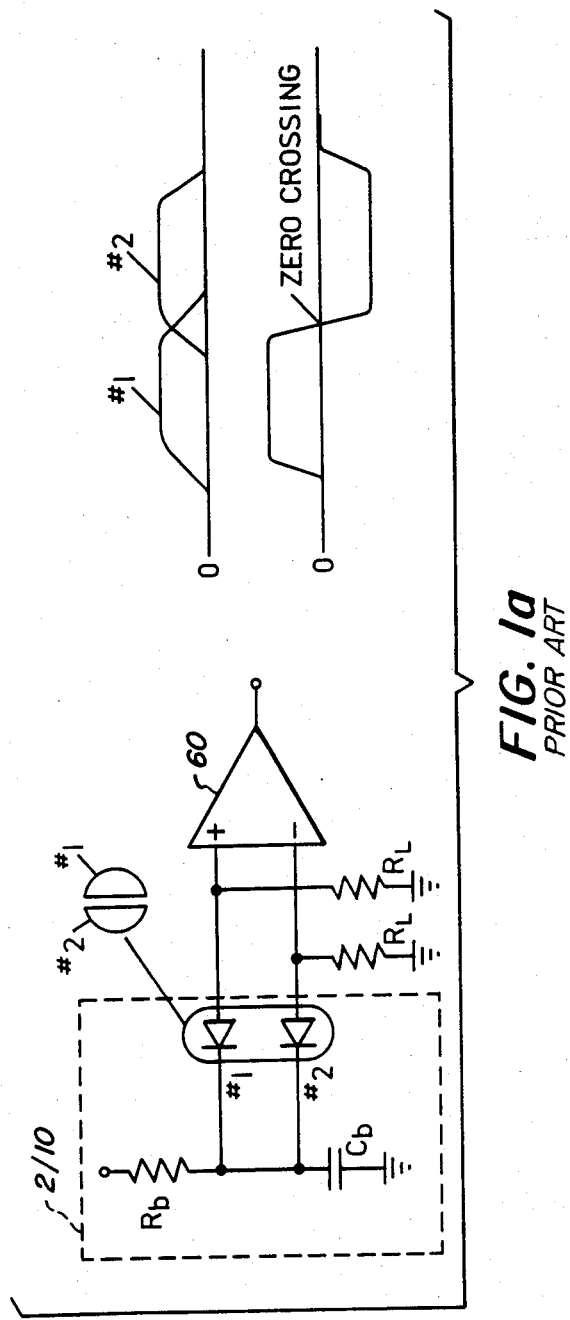
FIG. 1a is a schematic of the detector pulse circuits forming part of the circuit of FIG. 1.

Returning to the temporal synchronization method, FIG. 1a shows the two halves of the split detector that is used for synchronization as photodiode #1 and photodiode #2. These photodiodes are back biased to reduce the capacity of the photodiode junction, and are connected to relatively low impedance load resistors $R_L$ to insure a high speed response. As a scanning spot passes across the split detector, from #1 to #2 for example, the signal that is developed across each load resistor will be proportional to the total power that is incident on the respective detector half. The waveforms that are shown are developed across the load resistors, and the amplified difference of these two waveforms is provided by the differential amplifier. The waveform output from the differential amplifier passes thru zero at the instant that the scanning spot passes across the split detector and the power that is incident on the two halves of the split detector are equal. It is this zero crossing that provides the synchronization timing. Two of the circuits shown in FIG. 1a are required in the circuits shown in FIG. 1, FIG. 2, and FIG. 3, one for SOS detector 2 the other for EOS detector 10.

Figure 4:
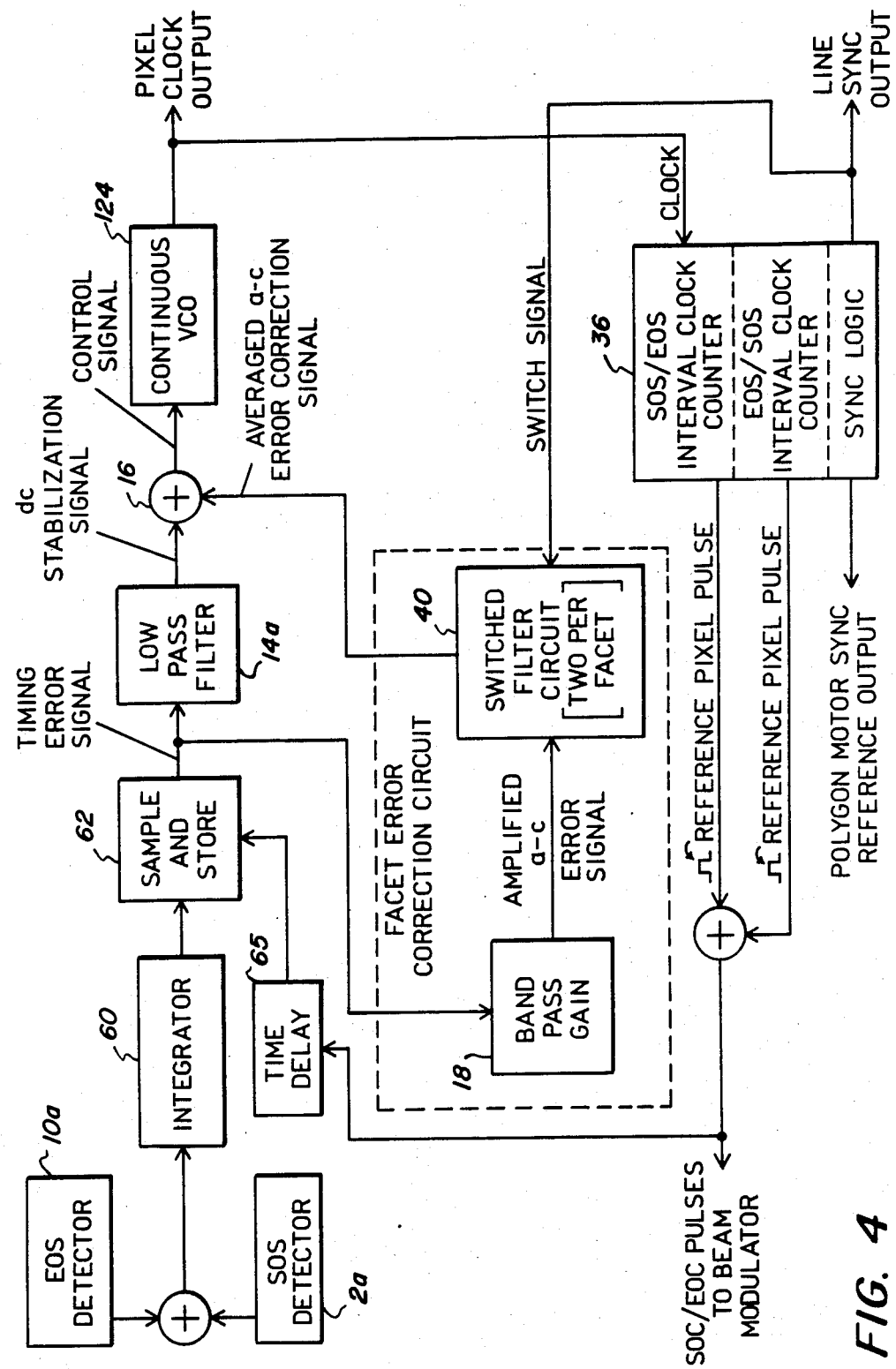
FIG. 4 is a block diagram of a spatial pixel clock synchronization system.
Figure 4A:
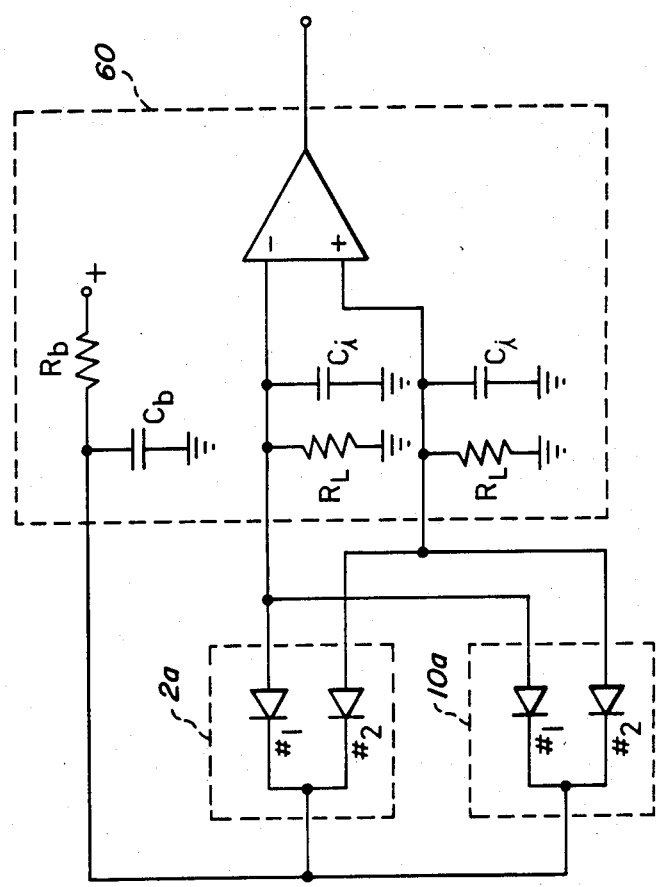
FIG. 4a is a schematic diagram of a detector/integrator circuit that can be utilized in the system of FIG. 4.

FIG. 4a shows, in its simplest form, the basic detector/integrator circuit used for pixel placement sensing that is needed to implement the spatial synchronization method. Although there are similarities between the circuit of FIG. 4a and the circuit of FIG. 1a, there are important differences. First, the back bias that is provided via $R_b$ and $C_b$ is not to reduce the capacitance of the photodiode junction, but is to insure that the photodiode operates in the linear portion of its characteristic curve, i.e. that portion of its transfer characteristic where the current is proportional to the power that is incident on the detector. Second, the signal is not developed across the load resistors $R_L$, but instead the photodiode current is accumulated in the integrating capacitors $C_i$. The load resistors $R_L$ are high impedance, and serve only to provide a discharge path for the integrating capacitors. The RC time constant that is formed by the resistors $R_L$ and capacitors $C_i$ are long relative to the charging time (charge time being the time that a photodiode current is being generated as a result of illumination thereof) but short relative to the interval between each charging period. The charging period is in the order of a few pixel periods, whereas the minimum discharge period is in the order of hundreds of pixel periods. Pixel periods would typically be on the order of one microsecond to tens of nanoseconds. Since the photodiode current charges the integrating capacitors rather than develop a fast waveform, it is not necessary that high speed techniques such as short leads and local amplifier be strictly observed. In FIG. 4a the two split detectors 2a and 10a have been shown connected in parallel, and remote to the integrating capacitors and amplifier. Stray capacitance, or shielding capacitance may form part or all of the integrating capacitance shown in FIG. 4a as $C_i$.

In operation, the pixel placement sensor is used to detect the error in the placement of the pixel exposure, the pixel being "placed" by the action of turning on the scanning beam for a short interval. The pixel placement sensor, being placed in the vicinity of the pixel exposure, receives a dose of energy on each half of the split detector, which causes a flow of current that is proportional to the power that falls on each detector. This current varys as the spot intensity increases at it is turned on, varys as the spot scans across the two detector halves, and varys as the scanning spot is turned off. The integrated currents, or coulomb quantities, that each detector half has produced is thus proportional to the photometric exposure that the respective detector half has received. These currents are accumulated in the integrating capacitors $C_i$, resulting in voltages that are proportional to the respective exposures. If the pixel exposure was centered on the split detector, such that both detector halves received equal exposure, then the resulting voltages will will be equal, and the output of the differential amplifier will be zero. On the other hand, if the pixel exposure was not centered, and one detector half received more energy that the other detector half, then the two integrated voltages will not be equal, and the output of the differential amplifier will reflect this difference.

Figure 5:
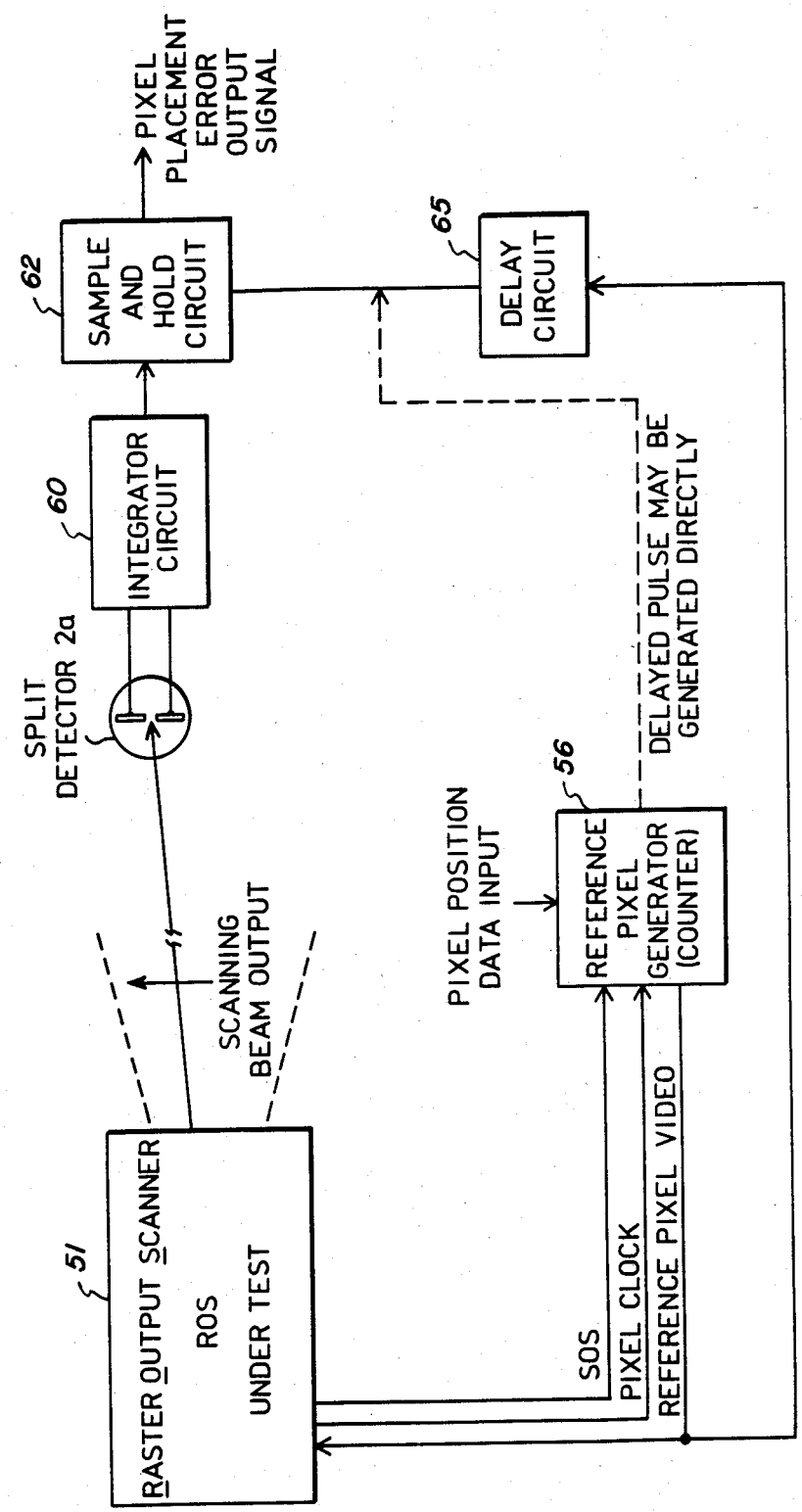
FIG. 5 is a block diagram of a pixel placement sensing system for use in a spatial syncrhonization system.

The circuit shown in FIG. 4a, and described above, can be used in a spatial synchronization system. Referring to FIG. 5, a Raster Output Scanner (ROS) 51 is to be tested for accuracy in placement of pixels. This ROS has internal to it, its own synchronization and pixel clock circuitry which is normally output to the video serving equipment such that stored images may be read out in synchronism with the scanning spot of the ROS. In this testing configuration, the pixel clock output and SOS pulse are used by the pixel generator 56 to generate a single reference pixel pulse which is fed back into the ROS as the video input. The scanning beam is thus turned on at some point along the scan, its position being dependent on the pixel position data that is selected at the input to the pixel generator.

With the split detector 2a placed at the point in the scan where the reference pixel is being exposed, the output of the integrator 60 generates an output voltage that is representative of the error in the placement of the pixel. The generation of this error voltage is not instantaneous or simultaneous with the input video as there are delays, for example, the acoustic propagation delay of an acousto-optic modulator. Also, the voltage developed by the integrator is temporary, as there are discharge resistors across the storage capacitance. The delay circuit 65 and the sample and store circuit 62 provide the means to "capture" the error signal shortly after the event occurs, and provides a d-c output voltage that is representative of the placement of the last pixel exposure. When one pixel is generated for each scan, the resultant pixel placement error waveform is not unlike the "signature" waveform that is generated by the circuits of FIGS. 1, 2, and 3. However, the circuit of FIG. 5 can be employed to perform other tasks of performance evaluation. For example, if the split detector is rotated 90 degrees relative to the typical arrangement used for synchronization, then the output signal will be representative of pixel placement errors caused by polygon wobble. Also if one pixel is generated for each revolution, then the repeatability of one facet can be readily evaluated, and effects such as polygon shaft nutation, optical component vibration, or random flucuations can be readily evaluated.

Other variations in the function of the circuit of FIG. 5 include the fact that it can measure the relative placement errors of "off" pixels simply by inverting the reference pixel video. Also, both jitter and wobble errors can be measured by using a beam splitter and two split detectors that are arranged to sense pixel position errors orthoganal to each other.

The "gain" of the pixel placement error signal generation, as described, is dependent on the beam intensity, i.e. the output volts per unit position error is proportional to the beam intensity. In most applications this presents no problem, as the device can be easily calibrated by displacing the detector a known amount, and noting the change in the error voltage. In applications where the gain must be made independent of beam intensity, a gain control signal can be readily generated by summing the voltage that is developed across the two integrating capacitors $C_i$ of FIG. 4a. This sum voltage can then be used in a conventional gain control manner.

The implementation of the spatial synchronization method is shown in FIG. 4 and may be compared to FIG. 2 which uses the temporal synchronization method. As can be seen, the phase comparator 8 of FIG. 2 has no counterpart in FIG. 4. This is an important and significant difference, as the outputs from detector 2a and detector 10a are connected directly to the differential integrator 60 which is the counterpart of the integrator 12 of FIG. 2. On the other hand, two new functions appear in FIG. 4 that do not appear in FIG. 2, these new functions being the sample and store 62 and time delay 65. All other functions shown in FIG. 4 are essentially the same as those similarly numbered functions shown in FIG. 2, thus the following discussion will only address these differences.

Referring to FIG. 4, the interval counter circuit 36 provides SOC and EOC "reference pixel pulses" to the time delay circuit 65 and also provides these pulses to the beam modulator. Initially, the scanning beam is turned off except for the duration of these "reference pixel pulses", these pulses also being delayed and used to initiate the sample and storage function of the integrator output signal. The delay in taking the sample of the integrator output signal is only sufficient to allow for such delays as the propagation time of an acoustic modulator, and any delay that occurs in the detector and integrator circuits.

When the system is fully syncrhonized, with each scan, the reference pixel pulses produce pixel exposures that are coincident with the split detectors. If the exposure is equal on both halves of the split detector, no differential voltage is developed at the integrator 60. If an exposure is placed unequally at the detector, then a differential voltage will be developed, and a correction signal is applied to the control circuit, much the same as was described for the temporal synchronization method of FIG. 2.

However, initially the reference pixel exposures do not occur synchronously with the scan, and the pixel exposures are not coincident on the detectors. Under this non-synchronous condition, the output of the integrator remains at zero, and no d-c stabilization signal is developed. Also initially, these reference pulses are not synchronous with the scanning rate, and therefore, they will turn the beam on at a different point of each scan, and cause the reference pixel exposures to "walk" across the scanned area until the exposure that is produced is coincident with the detectors. When the pixel exposure takes place on one half of one detector or another, then the respective integrating capacitor $C_i$ of FIG. 4a receives the full photodiode current while the other capacitor of the differential pair receives no current. A differential voltage is developed at the output of the differential integrator 60, this differential voltage being applied to the sample and hold circuit 62 just prior to its receipt of the delayed sample initiating pulse. The voltage that is developed by the integrator 60 is thus sampled and stored, and applied to the VCO frequency control circuits much the same as the integrator 12 output as shown in FIG. 1, FIG. 2, and FIG. 3.

I claim:

1. A temporal pixel clock synchronization system with jitter correction for an optical line scanner system having a polygon scanner, including
    first means for generating both a start of scan pulse and an end of scan pulse,
    second means for generating both a start of pixel count pulse and an end of pixel count pulse, third means coupled to said first and second means and supplied with said pulses for generating a timing error signal having an amplitude representing any error between the phase of the start of scan pulse and the start of count pulse and any error between the phase of the end of scan pulse and the end of count pulse, fourth means for generating a continuous oscillatory signal, fifth means coupled to the output of said third means and to the input of said fourth means and including a switched filter circuit with two storage elements for each facet of said polygon for generating from said error signal a frequency correction signal for said fourth means, and sixth means for coupling the output of said fourth means to the input of said second means.

2. The pixel clock system of claim 1 wherein said fifth means further includes a band pass filter coupled directly to the output of said third means, said switched filter circuit connected to receive the output of said bandpass filter.

3. The pixel clock system of claim 3 wherein said third means includes a phase comparator and an integrator.

4. The pixel clock system of claim 1 wherein said fourth means is a continuously running voltage controlled oscillator.

* * * * *